United States Patent [19]

Reuss et al.

[11] Patent Number: 4,860,077
[45] Date of Patent: Aug. 22, 1989

[54] VERTICAL SEMICONDUCTOR DEVICE HAVING A SIDEWALL EMITTER

[75] Inventors: Robert H. Reuss, Scottsdale, Ariz.; Kevin L. McLaughlin, Eau Claire, Wis.

[73] Assignee: Motorola, Inc., Schaumburg, Ill.

[21] Appl. No.: 101,470

[22] Filed: Sep. 28, 1987

[51] Int. Cl.⁴ .............................................. H01L 29/72
[52] U.S. Cl. ........................................ 357/34; 357/59
[58] Field of Search ................. 357/59 G, 59 H, 59 J, 357/59 K, 34, 54, 49, 65

[56] References Cited

U.S. PATENT DOCUMENTS 4,339,767  7/1982  Horng et al. ................ 357/59 H
4,764,799  8/1988  Malaviya ..................... 357/59 G
4,764,801  8/1988  McLaughlin et al. .......... 357/59 H
4,769,687  9/1988  Nakazato et al. ............. 357/59 H

*Primary Examiner*—Martin H. Edlow
*Assistant Examiner*—Sara W. Crane
*Attorney, Agent, or Firm*—Harry A. Wolin

[57] ABSTRACT

A low capacitance, high performance semiconductor device is described having a sidewall emitter wherein the emitter width is relatively small (approximately 0.5 micrometers). This enables a small emitter-base interface which reduces capacitance. Additionally, the regions of the base and collector near their interface are lightly doped so that collector-base capacitance is greatly reduced.

6 Claims, 2 Drawing Sheets 4,860,077

VERTICAL SEMICONDUCTOR DEVICE HAVING A SIDEWALL EMITTER

BACKGROUND OF THE INVENTION

This invention generally pertains to a vertical semiconductor device having a sidewall emitter wherein the emitter is isolated by two dielectric layers in the side wall of a semiconductor region. Generally, in semiconductor devices of this type, it is desirable to have a low capacitance throughout the device because capacitance reduces the speed and performance of the device. Capacitance may be reduced by reducing the area of the interface between the emitter and base and also reducing the doping concentration at the collector-base interface.

At this time, state of the art semiconductor devices of this type generally have an emitter width of approximately 1 micrometer. By reducing this emitter width, the area of the emitter-base interface may be reduced thereby reducing the emitter-base capacitance. Additionally, reduced emitter width will create higher injection efficiency in the emitter and there will be less chance of carrier recombination in the base because the reduced emitter width limits outward diffusion. Therefore, it is desirable to have a semiconductor device comprising a relatively small emitter.

SUMMARY OF THE INVENTION

The present invention pertains to a vertical semiconductor device having a sidewall emitter. The emitter being disposed in the sidewall of a semiconductor region is further isolated by two dielectric layers. This allows for a narrow emitter width of less than 0.5 micrometers which creates a relatively small emitter-base interface area. This relatively small interface area is responsible for a highly reduced emitter-base capacitance and gives a semiconductor device with higher performance. Additionally, the reduced emitter width reduces the outward carrier diffusion from the emitter thereby decreasing the possibility of carrier recombination in the base and increasing emitter efficiency. The present invention also desirably comprises a collector and a base, both of which are relatively lightly doped at their interface thereby reducing collector-base capacitance and allowing for an even greater device performance.

It is an object of the present invention to provide a new and improved semiconductor device having a sidewall emitter wherein the emitter width is relatively small.

It is a further object of the present invention to provide a new and improved semiconductor device having a sidewall emitter wherein the area of the emitter-base interface is relatively small.

It is a further object of the present invention to provide a new and improved semiconductor device having a sidewall emitter having a reduced emitter-base capacitance.

It is a further object of the present invention to provide a new and improved semiconductor device having a sidewall emitter wherein the possibility of carrier recombination in the base is relatively small.

It is a further object of the present invention to provide a new and improved semiconductor device having a sidewall emitter wherein both the base and collector may be lightly doped at their interface thereby reducing collector-base capacitance.

These and other objects of this invention will become apparent to those skilled in the art upon consideration of the accompanying specification, claims and drawings.

BRIEF DESCRIPTION OF THE DRAWINGS

Referring to the drawings, wherein like characters indicated like parts throughout the figures.

DESCRIPTION OF THE PREFERRED EMBODIMENTS

Figure 1:
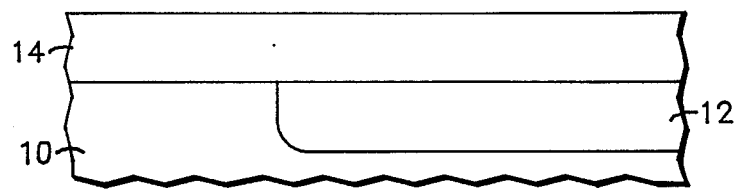
FIGS. 1-4 are highly enlarged cross-sectional views of a first embodiment of a semiconductor device having a sidewall emitter, during various stages of processing.
Figure 2:
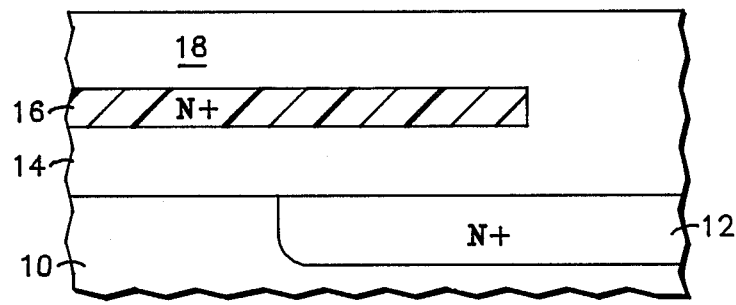
Figure 3:
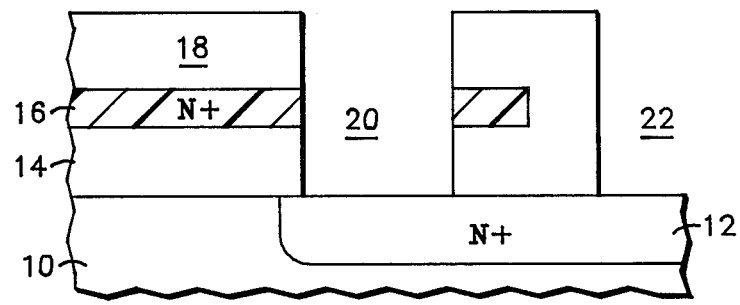
Figure 4:
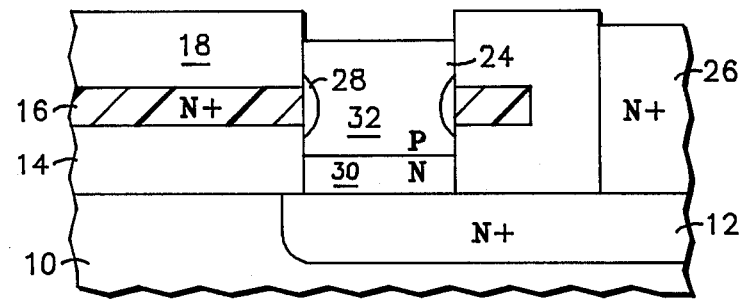

Referring specifically to FIGS. 1-4, highly enlarged cross-sectional views of the first embodiment of a semiconductor device having a sidewall emitter are shown during various stages of processing. Initially, a substrate, 10, is provided. Substrate 10 is commonly a semiconductor wafer of, for example, silicon, however, other materials well-known in the art may be used. A buried layer, 12, is formed in a predetermined region of substrate 10. Buried layer 12 is implanted in substrate 10 in this embodiment, however, other doping methods well-known in the art may be used.

Once buried layer 12 has been formed, a first dielectric layer, 14, is deposited on substrate 10. First dielectric 14 as well as other dielectric layers, which will be disclosed presently, may consist of an oxide, a nitride or a combination of oxides and nitrides. Silicon oxide and silicon nitride are examples of suitable materials well known in the art. In this embodiment, first dielectric layer 14 as well as the other dielectric layers are comprised of $SiO_2$. Although the dielectric layers in the preferred embodiments are deposited, they may be formed by many other methods well-known in the art.

Following the deposition of first dielectric layer 14, a first polysilicon layer, 16, is formed on first dielectric layer 14. Although polysilicon is used in the present embodiment, other polycrystalline materials may be used. First polysilicon layer 16 is then doped by methods well-known in the art. In this embodiment, first polysilicon layer 16 is doped with an N+ conductivity type. Next, first polysilicon layer 16 is patterned and then etched in a predetermined manner to provide islands of polysilicon material. This may also be performed using selective oxidation which is well known in the art. A second dielectric layer, 18, is then formed on first polysilicon layer 16 and first dielectric layer 14. A first opening, 20, and a second opening, 22, are now formed. Both first opening 20 and second opening 22 extend to substrate 10 and are disposed over buried layer 12 of substrate 10. In this embodiment, buried layer 12 has an N+ conductivity type. First opening 20 extends through second dielectric layer 18, first polysilicon layer 16 and first dielectric layer 14. Second opening 22 does not extend through the polysilicon layer 16, but does extend through second dielectric layer 18 and first dielectric layer 14.

Following the formation of first opening 20 and second opening 22, first epitaxial region, 24, and second epitaxial region, 26, are formed therein, respectively. Epitaxial regions 24 and 26 are selectively grown in this embodiment, however, they may be formed using other methods. Means for selective epitaxy of semiconductor materials are well known in the art.

Second epitaxial region 26 is doped with an N+ conductivity type. First epitaxial region 24 is doped so that a collector, 30, is formed over buried layer 12. In this embodiment, collector 30 is doped with an N conductivity type. A base, 32, is also formed in first epitaxial region 24. Base 32 has a P conductivity type. It is highly desirable but not essential that collector 30 and base 32 be lightly doped at their interface thereby reducing the base-collector capacitance of the semiconductor device.

A sidewall emitter, 28, is diffused into first epitaxial region 24 from first polysilicon layer 16. Emitter 28 has an N+ conductivity type. Because emitter 28 is diffused from first polysilicon layer 16, it may be controlled in depth and lateral area and kept relatively small. In the present embodiment, the emitter width, i.e., the extent of the emitter in the vertical direction (see FIG. 4), is less than 0.5 micrometers. Because emitter 28 may be kept relatively small, the emitter-base interface area may be kept relatively small thereby reducing emitter-base capacitance. The reduction of capacitance in a semiconductor device of this type enables higher performance. Additionally, since emitter 28 is relatively small, there is a limited amount of outward carrier injection from emitter 28 thereby greatly reducing the possibility of carrier recombination in base 32. Therefore, the carriers are properly injected and go through the narrow region of base 32 directly into collector 30.

Figure 5:
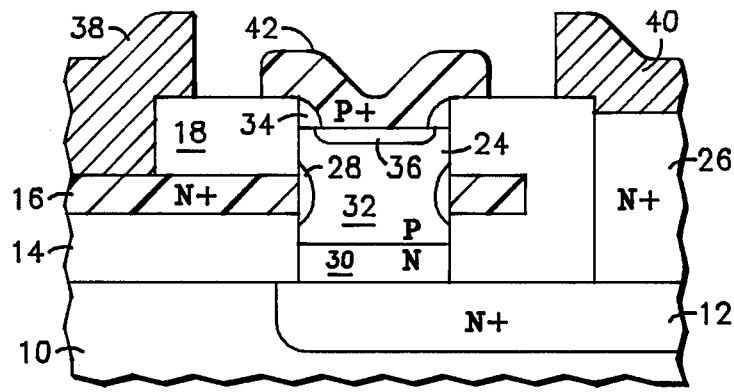
FIG. 5 is a highly enlarged cross-sectional view of a first embodiment of a semiconductor device having a sidewall emitter.

Referring specifically to FIG. 5, a highly enlarged cross-sectional view of a first embodiment of a semiconductor device having a sidewall emitter is shown. Sidewall spacers, 34, have been formed on first epitaxial region 24. Sidewall spacers 34 serve to limit the size of base contact diffusion, 36, which is implanted through a window in base contact, 42. Sidewall spacers 34 must limit size of base diffusion 36 so that base diffusion 36 and emitter 28 do not come in contact. It should be understood that sidewall spacers 34 are not essential if first epitaxial region 24 is large. However, a small first epitaxial region 24 reduces parasitics. In this embodiment, base contact 42 is made of polysilicon and is doped with a P+conductivity type. However, it should be understood that other conductive materials besides or in conjunction with polysilicon may be used for base contact 42.

An emitter contact, 38, is shown to extend through second dielectric layer 18 to first polysilicon layer 16. This is so that connection may be made to emitter 28. Additionally, a collector contact, 40, extends to second epitaxial region 26 which is connected to buried layer 12 which in turn is connected to collector 30. In this embodiment, emitter contact 38 and collector contact 40 are made of a metal such as aluminum, however, it should be understood that other conductive materials may also be used.

Figure 6:
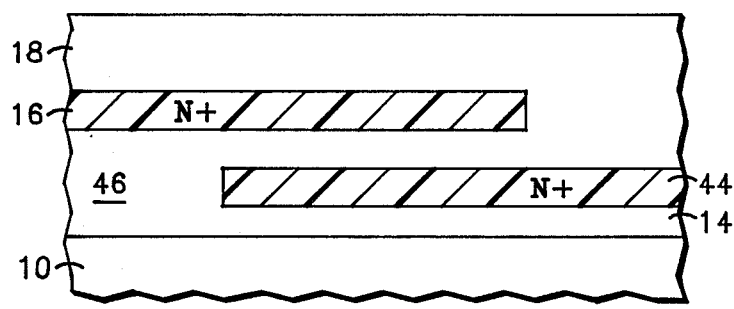
FIGS. 6-7 are highly enlarged cross-sectional views of a second embodiment of a semiconductor device having a sidewall emitter, during various stages of processing.
Figure 7:
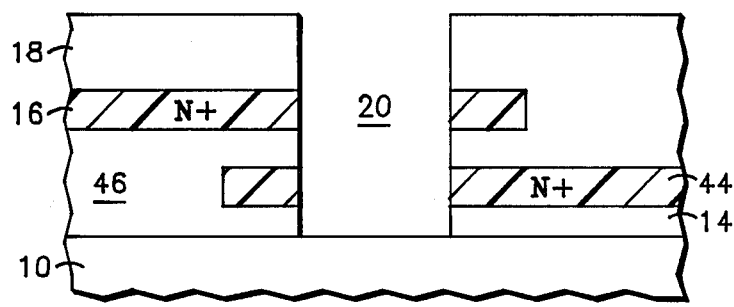

Referring specifically to FIGS. 6 and 7, highly enlarged cross-sectional views of a second embodiment of a semiconductor device having a sidewall emitter are shown during various stage of processing. Following the deposition of first dielectric layer 14, a second polysilicon layer, 44, is deposited thereon and doped. In this embodiment, second polysilicon layer 44 is doped with an N+ conductivity type. Next, second polysilicon layer 44 is patterned and etched in a predetermined manner to leave polysilicon islands on layer 14. Once this occurs, a third dielectric layer, 46, is deposited on second polysilicon layer 44 and first dielectric layer 14. Then, first polysilicon layer 16 is formed, doped and etched as discussed above. Once this has been done, second dielectric layer 18 is formed thereon. First opening 20 is then formed so that it extends to substrate 10 through dielectric layers 18, 46 and 14 and also polysilicon layers 16 and 44. In this embodiment, substrate 10 may but need not be a semiconductor. Dielectric materials, such as for example, sapphire or other materials on which high quality semiconductor regions 24 may be formed, will also serve. As used herein, the words "first" and "second" in connection with layers 16 and 44 respectively are intended merely for identification purposes and not to indicate the order of formation.

Figure 8:
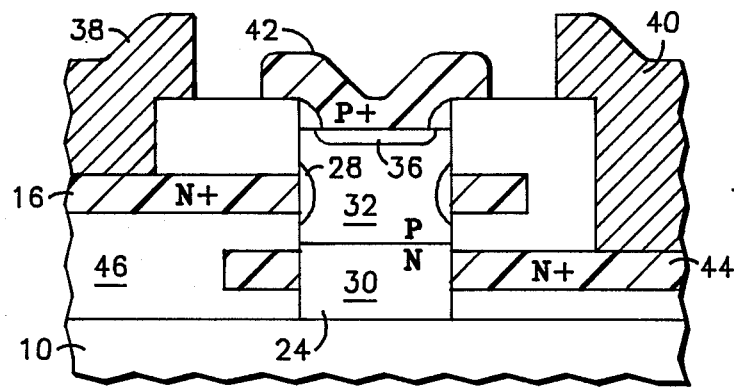
FIG. 8 is a highly enlarged cross-sectional view of a second embodiment of a semiconductor device having a sidewall emitter.

Referring specifically to FIG. 8, a highly enlarged cross-sectional view of a second embodiment of a semiconductor device having a sidewall emitter is shown. It can be seen that second polysilicon layer 44 extends to collector 30 in first epitaxial region 24. Collector contact 40 extends to second polysilicon layer 44 to form the contact thereto. Third dielectric layer 46 serves to separate first polysilicon layer 16 and second polysilicon layer 44. FIG. 8 does not have a buried layer and may, but need not have a second epitaxial region. The remainder of the device shown in the second embodiment is essentially the same as the device shown in the first embodiment. It should be understood that although both the first and second embodiments show NPN transistors, PNP transistors may be formed just as easily by using dopants of the opposite type. Additionally, it is possible to form complementary NPN and PNP transistors on the same substrate using the present invention by selectively doping the epitaxial regions and polycrystalline regions with the doping of the appropriate type. This will be understood by those of skill in the art.

Thus, it is apparent that there has been provided, in accordance with the invention, a new and improved semiconductor device having a sidewall emitter which meets the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. A vertical semiconductor device having a sidewall emitter comprising:
   a substrate;
   a first dielectric layer on said substrate;
   a first polycrystalline semiconductor region on said first dielectric layer, said first polycrystalline semiconductor region including a doped portion for contacting an emitter and acting as a diffusion source for said emitter;
   a second dielectric layer on said first polycrystalline semiconductor region;

a first epitaxial region extending from said substrate through said first and second dielectric layers and said first polycrystalline semiconductor region, said epitaxial region includes an emitter, a base and a collector portion disposed beneath said base portion, and wherein said emitter portion contacts said portion of said first polycrystalline semiconductor region at a location between said first and second dielectric layers; and a plurality of contacts, said contacts being electrically coupled to said emitter, said base and said collector.

2. The device of claim 1 further including a second epitaxial region electrically coupled to the collector by a doped buried layer in the substrate.

3. The device of claim 1 further comprising:
   a second polycrystalline semiconductor region on the first dielectric layer; and
   a third dielectric layer disposed between the first and said second polycrystalline semiconductor regions.

4. The device of claim 3 wherein said second polycrystalline semiconductor layer contacts the collector portion of said first epitaxial region.

5. The device of claim 3 wherein the dielectric layers are comprised of oxide, nitride or combinations of oxide and nitride.

6. The device of claim 5 wherein the dielectric layers comprise $SiO_2$.

* * * * *